(12) United States Patent
Zhou et al.

(10) Patent No.: US 11,476,373 B2
(45) Date of Patent: Oct. 18, 2022

(54) SOLAR CELL SUPERFINE ELECTRODE TRANSFER THIN FILM, MANUFACTURING METHOD AND APPLICATION METHOD THEREOF

(71) Applicant: SVG OPTRONICS, CO., LTD., Jiangsu (CN)

(72) Inventors: Xiaohong Zhou, Jiangsu (CN); Zongbao Fang, Jiangsu (CN); Linsen Chen, Jiangsu (CN); Pengfei Zhu, Jiangsu (CN); Donglin Pu, Jiangsu (CN); Ximei Yin, Jiangsu (CN); Yunlong Zhao, Jiangsu (CN)

(73) Assignee: SVG OPTRONICS CO., LTD., SuZhou (CN)

( * ) Notice: Subject to any disclaimer, the term of this patent is extended or adjusted under 35 U.S.C. 154(b) by 0 days.

(21) Appl. No.: 15/305,748

(22) PCT Filed: Mar. 30, 2015

(86) PCT No.: PCT/CN2015/075380
§ 371 (c)(1),
(2) Date: Oct. 21, 2016

(87) PCT Pub. No.: WO2015/188646
PCT Pub. Date: Dec. 17, 2015

(65) Prior Publication Data
US 2017/0054043 A1  Feb. 23, 2017

(30) Foreign Application Priority Data

Jun. 13, 2014 (CN) .......................... 201410265681.4

(51) Int. Cl.
*H01L 31/00* (2006.01)
*H01L 31/0224* (2006.01)
(Continued)

(52) U.S. Cl.
CPC ............... *H01L 31/022433* (2013.01); *H01L 31/02168* (2013.01); *H01L 31/022425* (2013.01); *H01L 31/1864* (2013.01); *Y02E 10/50* (2013.01)

(58) Field of Classification Search
CPC .............................. H01L 31/00; H01L 21/00
See application file for complete search history.

(56) References Cited

U.S. PATENT DOCUMENTS 5,992,320 A    11/1999  Kosaka et al.
6,207,268 B1 *  3/2001  Kosaka ................. B41M 5/265
                                                  428/206
(Continued)

FOREIGN PATENT DOCUMENTS

CN    1648091 A    8/2005
CN    1875433 A    12/2006
(Continued)

OTHER PUBLICATIONS

JP-07279099 A, Google translate (Year: 1995).*
(Continued)

*Primary Examiner* — David P Turocy
*Assistant Examiner* — Mohammad Mayy
(74) *Attorney, Agent, or Firm* — Joe Zheng

(57) ABSTRACT

Provided are a solar cell superfine electrode transfer thin film, manufacturing method and application method thereof. The electrode transfer thin film sequentially includes from bottom to top a substrate, a release layer, a resin layer and a hot melt adhesive layer; the resin layer is formed with electrode trenches therein; the electrode trenches are formed with electrodes therein; superfine conductive electrodes are continuously prepared on a transparent thin film via a roll-to-roll nanoimprinting method, the width of an electrode wire being 2 μm-50 μm, and the width of a typical line being
(Continued)

10 μm-30 μm. Directly attach the superfine electrodes of the hot melt adhesive layer to a solar cell by peeling off the substrate material, and sintering at a high temperature to volatilize the hot melt adhesive layer material while retaining the electrodes, thus the electrodes are integrally transferred, without poor local transfer.

14 Claims, 1 Drawing Sheet

(51) Int. Cl.
    *H01L 31/0216*     (2014.01)
    *H01L 31/18*     (2006.01)

(56) References Cited

U.S. PATENT DOCUMENTS

| | | | |
|---|---|---|---|
| 2007/0079869 A1 | 4/2007 | Yukinobu | |
| 2008/0311330 A1* | 12/2008 | Schindler | H01L 31/022425 |
| | | | 428/40.2 |
| 2009/0133922 A1 | 5/2009 | Okazaki et al. | |
| 2009/0218651 A1 | 9/2009 | Frolov et al. | |
| 2010/0258182 A1* | 10/2010 | Akimoto | H01B 1/16 |
| | | | 136/256 |
| 2012/0110807 A1* | 5/2012 | Kim | H01B 1/16 |
| | | | 29/25.41 |
| 2012/0125434 A1 | 5/2012 | Doi | |
| 2012/0127697 A1* | 5/2012 | Kim | B32B 37/26 |
| | | | 362/97.2 |
| 2012/0132273 A1* | 5/2012 | Lee | H01L 31/022425 |
| | | | 136/256 |
| 2014/0134328 A1* | 5/2014 | Choi | G06F 3/044 |
| | | | 427/98.4 |

FOREIGN PATENT DOCUMENTS

| | | |
|---|---|---|
| CN | 101043078 A | 9/2007 |
| CN | 101120626 A | 2/2008 |
| CN | 101482938 A | 7/2009 |
| CN | 101562217 A | 10/2009 |
| CN | 102063951 A | 5/2011 |
| CN | 102449777 A | 5/2012 |
| CN | 102576745 A | 7/2012 |
| CN | 103310991 A | 9/2013 |
| CN | 103640279 A | 3/2014 |
| CN | 104009124 A | 8/2014 |
| JP | 07279099 A * | 10/1995 |
| JP | 2010114032 A | 5/2010 |
| KR | 20120078875 A | 7/2012 |

OTHER PUBLICATIONS

International Search Report issued in PCT/CN2015/075380 dated Jul. 2, 2015 (6 pages).
SIPO Third Office Action issued in Chinese Patent Application No. 201410265681.4 dated Dec. 14, 2016 (with English Summary) (10 pages).
German Examination Report for German Application No. 11 2015 002 790.4, dated Jul. 17, 2019, with partial translation, 7 pages.

* cited by examiner

SOLAR CELL SUPERFINE ELECTRODE TRANSFER THIN FILM, MANUFACTURING METHOD AND APPLICATION METHOD THEREOF

The present application is the U.S. National Phase Application of PCT/CN2015/075380, titled "SOLAR CELL SUPERFINE ELECTRODE TRANSFER THIN FILM, MANUFACTURING METHOD AND APPLICATION METHOD THEREOF," filed Mar. 30, 2015, which claims priority to Chinese Patent Application No. 201410265681.4, entitled "SOLAR CELL SUPERFINE ELECTRODE TRANSFERRING THIN FILM, PREPARING METHOD AND APPLICATION METHOD OF SOLAR CELL SUPERFINE ELECTRODE TRANSFERRING THIN FILM", filed on Jun. 13, 2014 with the State Intellectual Property Office of People's Republic of China, both of which are incorporated herein by reference in their entireties.

FIELD

The present disclosure relates to the technical field of solar battery, and in particular to a hyperfine electrode transfer film for a solar battery, a method for producing the same, and a method for applying the same.

BACKGROUND

Monocrystalline silicon solar batteries and polysilicon solar batteries are commonly produced by forming surface electrodes on a silicon surface with a process of precise screen printing. Normally, the electrodes have a linewidth of 60 μm to 100 μm. Clogging may occur to the screen printing with the linewidth of 60 μm due to characteristics of screen and electroconduction slurry, thereby affecting the yield and the quality of electrodes. Further, the electrodes with a large linewidth has two disadvantages, i.e., large consumption of electroconduction slurry which results in a high cost, and a large coverage for surface electrodes on the silicon chip which affects the photoelectric conversion efficiency of battery. Therefore, it is important to reduce the linewidth of the surface electrodes, decrease the consumption of electroconduction slurry and increase the light-receiving area of battery.

The production of surface electrodes of solar battery is restricted by the following factors: compatibility with existing processes of solar battery, easy implementation, support for efficient processing, a composite cost lower than the costs for screen printing (including the costs for the screen and electroconduction slurry), and ease of mass production of materials.

In a method for producing a front electrode for a solar battery disclosed in Chinese Patent Application No. 201080023219.3 (corresponding to publication no. CN 10244977) which is also a PCT application, which is incorporated by reference, an electrode is formed by filling a mold imprinted with a pattern, then is transferred from the mold by means of an adhesive film and burned onto a semiconductor substrate. The PDMS mold used in the disclosure is soft and therefore is vulnerable, and the electrode has a linewidth above 20 μm, therefore, directly burning the electrode onto the semiconductor substrate will cause problems of production efficiency and environment control.

To address the above issues, it is required to provide a hyperfine electrode transfer film for a solar battery, a method for producing the same and a method for applying the same.

SUMMARY

In view of the above, there is provided a hyperfine electrode transfer film for a solar battery, a method for producing the same, and a method for applying the same, so as to solve the problems in the conventional technology.

In order to achieve the above objective, technical solutions according to embodiments of the present disclosure are as follows.

A hyperfine electrode transfer film for a solar battery is provided, where the electrode transfer film includes a substrate, a release layer, a resin layer and a hot-melt adhesive layer from bottom to top, electrode trenches are formed in the resin layer, and electrodes are formed in the electrode trenches.

As a further improvement, the electrode trenches and the electrodes have a comb-like structure or a honeycomb structure corresponding to the solar battery.

As a further improvement, the electrodes are made of a mixed material of glass microsphere frit and electroconduction slurry.

As a further improvement, the release layer has a thickness of 0.5 μm to 1.2 μm, and the hot-melt adhesive layer has a thickness of 0.5 μm to 2.0 μm.

As a further improvement, each of the electrode trenches has a linewidth of 2 μm to 50 μm and a depth of 2 μm to 60 μm.

As a further improvement, each of the electrode trenches has a linewidth of 10 μm to 30 μm.

Accordingly, a method for producing the hyperfine electrode transfer film for a solar battery includes:

S1, providing the substrate;
S2, applying the release layer on the substrate;
S3, applying the resin layer on the release layer, and forming the electrode trenches by imprinting on the resin layer with a convex mold corresponding to an electrode structure, where a linewidth and a depth of each of the electrode trenches are adjusted based on an requirement for electrode electroconductivity; and
S4, forming the electrodes by filling the electrode trenches with electroconduction slurry and baking, and applying the hot-melt adhesive layer on the electrodes.

As a further improvement, the forming the electrodes in step S4 includes:

filling the electrode trenches with glass frit and electrocondution slurry, and sintering at a low temperature less than 150 Celsius degrees.

As a further improvement, the filling the electrode trenches with glass frit and electrocondution slurry includes: filling the electrode trenches with the glass frit and the electrocondution slurry at the same time; or filling the electrode trenches with the glass frit first and then with the electroconduction slurry.

Accordingly, a method for applying the hyperfine electrode transfer film for a solar battery includes:

attaching the hot-melt adhesive layer of the electrode transfer film to an anti-reflection layer on a surface of the solar battery, and heating to bond the hot-melt adhesive layer with the anti-reflection layer;

removing the release layer and the substrate to combine the transparent electrodes on the surface of the solar battery; and sintering at a high temperature to volatilize the hot-melt adhesive layer, fuse the electrodes to the surface of the solar battery and completely transfer the hyperfine transparent electrodes.

In the present disclosure, roll-to-roll nanoimprinting is adopted, conductive electrodes are produced continuously on a transparent film and are transferred as a whole, and poor transfer will not occur locally. Furthermore, the hot-melt adhesive layer and the semiconductor substrate are sintered directly at a high temperature, to volatilize the hot-melt adhesive layer and retain the electrodes, thereby achieving reliability, high efficiency and convenience for application.

BRIEF DESCRIPTION OF THE DRAWINGS

The accompanying drawings required for the description of the embodiments or the conventional technology are described briefly as follows, so that the technical solutions according to the embodiments of the present disclosure or in the conventional technology become clearer. It is apparent that the accompanying drawings in the following description are only some embodiments of the present disclosure. For those skilled in the art, other accompanying drawings may be obtained according to these accompanying drawings without any creative work.

DETAILED DESCRIPTION OF EMBODIMENTS

Embodiments are described in detail below in conjunction with the companying drawings. However, the embodiments are not intended to limit the disclosure. Any changes of structure, method or function made by those skilled in the art based on the embodiments fall within the protection scope of the present disclosure.

Figure 1:
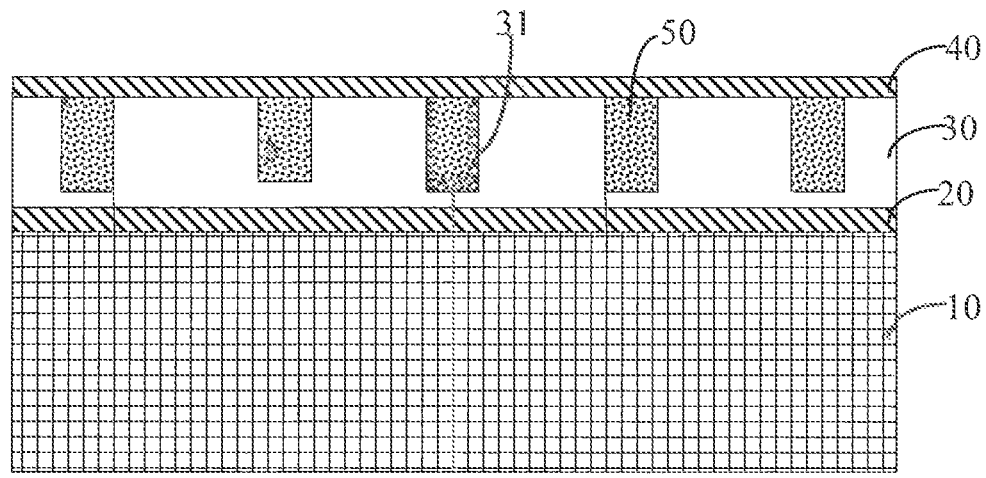
FIG. 1 is a structural diagram of an electrode transfer film of the present disclosure.

A hyperfine electrode transfer film for a solar battery is disclosed. Referring to FIG. 1, the electrode transfer film includes a substrate 10, a release layer 20, a resin layer 30 and a hot-melt adhesive layer 40 from bottom to top. Electrode trenches 31 are formed in the resin layer 30, and electrodes 50 are formed in the electrode trenches 31.

The layers of the disclosure are described as follows.

The substrate 10 normally includes a plastic film or a piece of paper.

The release layer 20 includes a film having a surface separability. Normally, in order to increase a release force of the plastic film or the paper, the release layer is formed by performing a plasma process or a fluoridization process on the plastic film or the paper, or applying a silicon release agent on a surface of a film material. No stickiness or slight stickiness exists between the release layer and a certain material which are contacted under a limited condition.

In the present disclosure, the release layer is configured to release the resin layer 30 and the hot-melt adhesive layer 40 from the substrate 10. Preferably, the release layer has a thickness of 0.5 μm to 1.2 μm.

The resin layer 30 is made of UV photosensitive resin. The electrode trenches 31 are formed by imprinting on the resin layer with a convex mold corresponding to an electrode structure. The electrode trenches 31 are configured to grow the electrodes 50. Preferably, each of the electrode trenches has a linewidth of 2 μm to 50 μm and a depth of 2 μm to 60 μm. Preferably, the electrode trenches have a typical linewidth of 10 μm to 30 μm. The electrodes are made of a mixed material of glass frit and electroconduction slurry. The electrodes are preferably in a form of silver wire, and may be made of metal material in a form of gold wire or copper wire in other embodiments.

Figure 2:
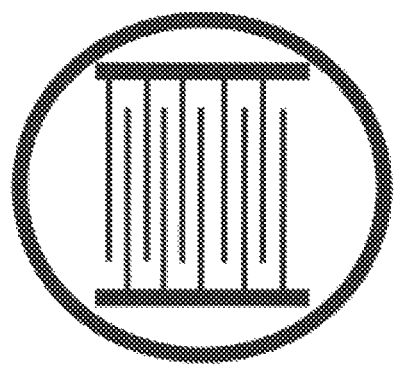
FIG. 2 is a structural diagram of electrodes having a comb-like structure according to an embodiment of the present disclosure.
Figure 3:
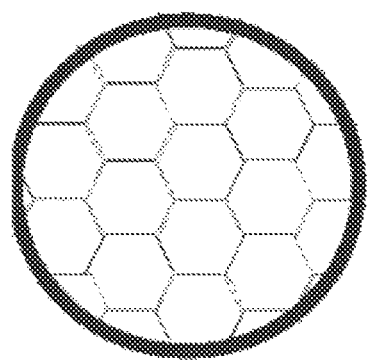
FIG. 3 is a structural diagram of electrodes having a honeycomb structure according to an embodiment of the present disclosure.

Referring to FIGS. 2 and 3, the electrode trenches 31 and the electrodes 50 may have a comb-like structure or a honeycomb structure correspondingly.

The hot-melt adhesive layer 40 is volatilized after being sintered at a high temperature. Preferably, the hot-melt adhesive layer 40 has a thickness of 0.5 μm to 2 μm.

A method for producing the hyperfine electrode transfer film for a solar battery is also provided in the present disclosure. The method includes step S1 to step S4.

In step S1, the substrate 10 is provided.

In step S2, the release layer 20 having a thickness of 0.5 μm to 1.2 μm is applied on the substrate 10.

In step S3, the resin layer 30 is applied on the release layer 20, and the electrode trenches 31 are formed by imprinting on the resin layer 30 with a convex mold corresponding to an electrode structure. The electrode trenches 31 and the electrodes 50 have a comb-like structure or a honeycomb structure. A linewidth and a depth of each of the electrode trenches are adjusted based on a requirement for electrode electroconductivity.

In step S4, the electrodes 50 are formed, by filling the electrode trenches 31 with electroconduction slurry and baking, and the hot-melt adhesive layer 40 having a thickness of 0.5 μm to 2 μm is applied on the electrodes.

The electrodes in step S2 are formed by filling the electrode trenches with the glass frit and the electroconduction slurry through brushing, and sintering (baking) at a low temperature less than 150 Celsius degrees.

Furthermore, the glass frit and the electroconduction slurry are filled at the same time, or the glass frit is filled first and then the electroconduction slurry is filled. Preferably, the percentage of the electroconduction slurry mass is 80% and may be other percentage of mass in other embodiments.

In the present disclosure, a method for applying the hyperfine electrode transfer film for a solar battery includes the following steps:

attaching the hot-melt adhesive layer of the electrode transfer film to an anti-reflection layer on the surface of the solar battery, and heating to bond the hot-melt adhesive layer with the anti-reflection layer;

removing the release layer and the substrate, to combine the transparent electrodes onto the surface of the solar battery; and sintering at a high temperature, to volatilize the hot-melt adhesive layer, fuse the electrodes to the surface of the solar battery, and completely transfer the hyperfine transparent electrodes.

For the hyperfine electrode transfer film for a solar battery, the method for producing the same, and the method for applying the same in the present disclosure, roll-to-roll nanoimprinting is adopted, conductive electrodes are produced continuously on a transparent film and are transferred as a whole, and poor transfer will not occur locally. Furthermore, the hot-melt adhesive layer and the semiconductor substrate are sintered directly at a high temperature, to volatilize the hot-melt adhesive layer and retain the electrodes, thereby achieving reliability, high efficiency and convenience for application.

In the present disclosure, the battery includes but is not limited to a solar battery. The solar battery includes but is not limited to an amorphous silicon or microcrystalline silicon film battery, a CIGS battery, a dye-sensitized solar battery, an organic solar battery, a gallium arsenide battery, and the like.

In summary, the technical solutions in the present disclosure have the following advantages over the conventional technology.

The electrodes are produced continuously on a transparent film by roll-to-roll nanoimprinting, the electrodes are transferred as a whole, and poor transfer will not occur locally.

The hot-melt adhesive layer and the semiconductor substrate are sintered directly at a high temperature, to volatilize the hot-melt adhesive layer and retain the electrodes, thereby achieving reliability, high efficiency and convenience for application.

A linewidth less than 30 μm can be realized, and the coverage for the electrodes on a surface of a silicon chip is reduced by at least 50%.

The electrodes having the honeycomb structure can further reduce the distance for which a current of the solar battery transmits to the electrodes, and the carrier recombination rate, and is advantageous for improving the conversion efficiency.

For those skilled in the art, it is apparent that the present disclosure is not limited to the details in the above exemplary embodiments, but can be embodied in other forms without departing from the spirit or basic features of the present disclosure. Therefore, the embodiments should be regarded as exemplars rather than limitation in any aspects. The scope of the present disclosure is defined by the appended claims rather than the above description. All variations within the meaning and scope of equivalents of the claims are included in the present disclosure. Any drawing reference in the claims should not be considered as limitation to a related claim.

Furthermore, it should be understood that the technical solutions in the present disclosure are describe with embodiments, but it does not mean that each embodiment only includes one dependent technical solution. The manner of description is only for clearness, and those skilled in the art should treat the description as a whole. The technical solutions in the embodiments can be combined properly to obtain another embodiment understandable by those skilled in the art.

The invention claimed is:

1. A method for producing a hyperfine electrode transfer film for a solar battery, the method comprising:
    providing a substrate;
    applying a release layer on the substrate, wherein the release layer covers an entire surface of the substrate, wherein the release layer is formed by performing a plasma process or a fluoridization process on a plastic film or a paper, or applying a silicon release agent on a surface of a film material;
    applying a resin layer on the release layer, the resin layer made of UV photosensitive resin, and
    forming a plurality of electrode trenches by imprinting on the resin layer with a convex mold corresponding to an electrode structure, wherein a linewidth and a depth of each of the electrode trenches are adjusted based on a requirement for electrode electroconductivity;
    growing a plurality of electrodes, each of the electrodes in one of the electrode trenches by filling the one of the electrode trenches with a mixed material of glass frit and electrocondution slurry, wherein the electrodes do not extend to the release layer; and
    applying a hot-melt adhesive layer on the electrodes, wherein the hot-melt adhesive layer covering an entire surface of the resin layer is volatilized after being sintered at a high temperature, to fuse the electrodes to a surface of the solar battery.

2. The method according to claim 1, further comprising:
    attaching the hot-melt adhesive layer to an anti-reflection layer on the surface of the solar battery, and
    heating to bond the hot-melt adhesive layer with the anti-reflection layer.

3. The method according to claim 2, further comprising:
    removing the release layer and the substrate;
    sintering at a high temperature to volatilize the hot-melt adhesive layer, fuse the electrodes to the surface of the solar battery.

4. The method for producing the hyperfine electrode transfer film for a solar battery according to claim 1, wherein the electrode trenches and the electrodes have a comb-like structure or a honeycomb structure corresponding to the solar battery.

5. The method for producing the hyperfine electrode transfer film for a solar battery according to claim 1, wherein the electrodes are made of a mixed material of glass microsphere frit and electroconduction slurry.

6. The method for producing the hyperfine electrode transfer film for a solar battery according to claim 1, wherein the release layer has a thickness between 0.5 μm and 1.2 μm, and the hot-melt adhesive layer has a thickness between 0.5 μm and 2.0 μm.

7. The method for producing the hyperfine electrode transfer film for a solar battery according to claim 1, wherein each of the electrode trenches has a linewidth between 2 μm and 50 μm and a depth between 2 μm and 60 μm.

8. The method for producing the hyperfine electrode transfer film for a solar battery according to claim 1, wherein each of the electrode trenches has a linewidth between 10 μm and 30 μm.

9. The method according to claim 1, wherein said growing a plurality of electrodes comprises:
    filling the electrode trenches with the glass frit and the electrocondution slurry at the same time.

10. The method according to claim 9, wherein the glass frit and the electrocondution slurry are maintained according to a predefined ratio.

11. The method according to claim 9, wherein each pair of the electrodes and the electrode trenches are confined to a comb-like structure.

12. The method according to claim 9, wherein each pair of the electrodes and the electrode trenches are confined to a honeycomb structure.

13. The method according to claim 1, wherein said growing a plurality of electrodes comprises:
    filling the electrode trenches with the glass frit first and then with the electroconduction slurry.

14. The method according to claim 1, wherein said forming a plurality of electrode trenches by imprinting on the resin layer with a convex mold corresponding to an electrode structure comprises:
    producing the electrode trenches in the resin continuously by roll-to-roll nanoimprinting.

* * * * *